(12) United States Patent
Cho et al.

(10) Patent No.: US 6,459,642 B1
(45) Date of Patent: Oct. 1, 2002

(54) SEMICONDUCTOR MEMORY DEVICE

(75) Inventors: Beak Hyung Cho; Du Eung Kim; Jong Pil Son, all of Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 141 days.

(21) Appl. No.: 09/703,820

(22) Filed: Nov. 1, 2000

(51) Int. Cl.$^7$ .................................................. G11C 7/00
(52) U.S. Cl. ............... 365/225.7; 365/226; 365/230.03; 365/200
(58) Field of Search ............................. 365/225.7, 226, 365/200, 230.03

(56) References Cited

U.S. PATENT DOCUMENTS

| | | | |
|---|---|---|---|
| 5,757,716 A | * 5/1998 | Lee ........................... | 365/225.7 |
| 5,896,328 A | * 4/1999 | Tanizaki et al. ............. | 365/200 |
| 6,208,567 B1 | * 3/2001 | Yamauchi et al. ..... | 365/230.03 |
| 6,246,627 B1 | * 6/2001 | Yamauchi et al. .......... | 365/226 |

* cited by examiner

*Primary Examiner*—Huan Hoang
(74) *Attorney, Agent, or Firm*—F. Chau & Associates, LLP

(57) ABSTRACT

The invention discloses a semiconductor memory device in which faulty cells causing standby current failure will be replaced with redundancy cells. The semiconductor memory device includes: a plurality of word lines, a plurality of bit lines, a plurality of cells connected between the word lines and bit lines for storing data and a memory cell array of a plurality of cell blocks having a plurality of cell power lines for providing supply voltage to the cells; a plurality of row decoder circuits for decoding external row addresses and generating selection signals for predetermined word lines included in the cell blocks; and a plurality of cell power repairing circuits for selectively blocking between cell power lines providing supply voltage to faulty cells and power source at an occurrence of faulty cells causing standby current failure. At this time, the cell power lines of the cell blocks are arranged in an identical direction to word lines; the row decoder circuits are respectively arranged between two neighboring cell blocks; and the cell power repairing circuits are respectively arranged between the cell blocks of the memory cell array, thereby reducing the size of a chip.

19 Claims, 10 Drawing Sheets

SEMICONDUCTOR MEMORY DEVICE

BACKGROUND OF THE INVENTION

1. Field of the Invention

The present invention relates to a semiconductor memory device and more particularly to a semiconductor memory device in which faulty cells causing standby current failure can be replaced with redundancy cells.

2. Description of the Prior Art

In general, standby current is regarded as a crucial factor in a low power semiconductor memory products, common to all portable information and communication devices, so that it should be taken into consideration in designing a semiconductor memory chip and a method has been required to replace faulty cells causing standby current failure with redundancy cells.

Particularly, if the standby current failure is caused by current leakage at supply voltage (Vcc) node, the possibility of repairing such faulty cells definitely depends on presence of a cell power repairing circuit to stop supply voltage (Vcc) from flowing to cells. Therefore, the presence of the cell power repairing circuit can exert a great deal of influence on the yield of products.

A semiconductor memory device of the prior art includes: cell power lines arranged between bit lines in an identical direction for providing supply voltage to cells of memory cell array; and cell power repairing circuits arranged at the periphery of the memory cells in the direction of word lines for blocking supply voltage from flowing to the cell power lines. Detecting a faulty cell causing standby current failure, a corresponding cell power repairing circuit stops supply voltage from flowing to a cell power line connected with the faulty cell, thereby enabling the faulty cell to be replaced with redundancy cells. The prior art about the cell power repairing circuits as such has been disclosed in Japanese patents Nos. Hei 10-199290 and Hei 05-314790.

In the prior art, the cell power lines have been arranged in an identical direction to bit lines to result in a large size of a chip. In consequence, it has been necessary to figure out a method to make a reduction in the size of a chip in order to keep up with a current trend of minimizing the size of a semiconductor memory device.

SUMMARY OF THE INVENTION

Therefore, it is an object of the present invention to provide a semiconductor memory device in which cell power lines are arranged in n identical direction to word lines and cell power repairing circuits are arranged between cell blocks of a memory cell array to thereby reduce the size of a chip.

It is another object of the present invention to provide an arrangement structure and method of cell power repairing circuits adequate for a high integration semiconductor memory device.

In order to accomplish the aforementioned object of the present invention, there is provided a semiconductor memory device including: a plurality of word lines, a plurality of bit lines, a plurality of cells connected between the word lines and bit lines for storing data and a memory cell array of a plurality of cell blocks having a plurality of cell power lines for providing supply voltage to the cells; a plurality of row decoder circuits for decoding external row addresses and generating selection signals for predetermined word lines of the cell blocks; and a plurality of cell power repairing circuits for selectively blocking between cell power lines which provide supply voltage to faulty cells and power source if there are any faulty cells causing standby current failure, wherein the cell power lines are arranged between the word lines in an identical direction; the row decoder circuits are respectively arranged between two neighboring cell blocks; and the cell power repairing circuits are also respectively arranged between cell blocks.

According to another aspect of the present invention, there are provided in a static random access memory device cell power repairing circuits to selectively block an electrical connection between power supply lines and cell power lines corresponding to any faulty memory cells in occurrences of standby current failure. At this time, the cell power repairing circuits are arranged in an identical direction of word lines between separate memory cell array blocks, and the fuses which actually construct the cell power repairing circuits are arranged in a predetermined length to the direction of word lines and extended to the direction of bit lines.

BRIEF DESCRIPTION OF THE DRAWINGS

Objects and aspects of the invention will become apparent from the following description of an embodiment with reference to the accompanying drawings in which.

DETAILED DESCRIPTION OF THE PRESENT INVENTION

In order to improve understanding of the present invention, an embodiment of the prior art will be described with reference to the accompanying drawings for comparison.

Figure 1:
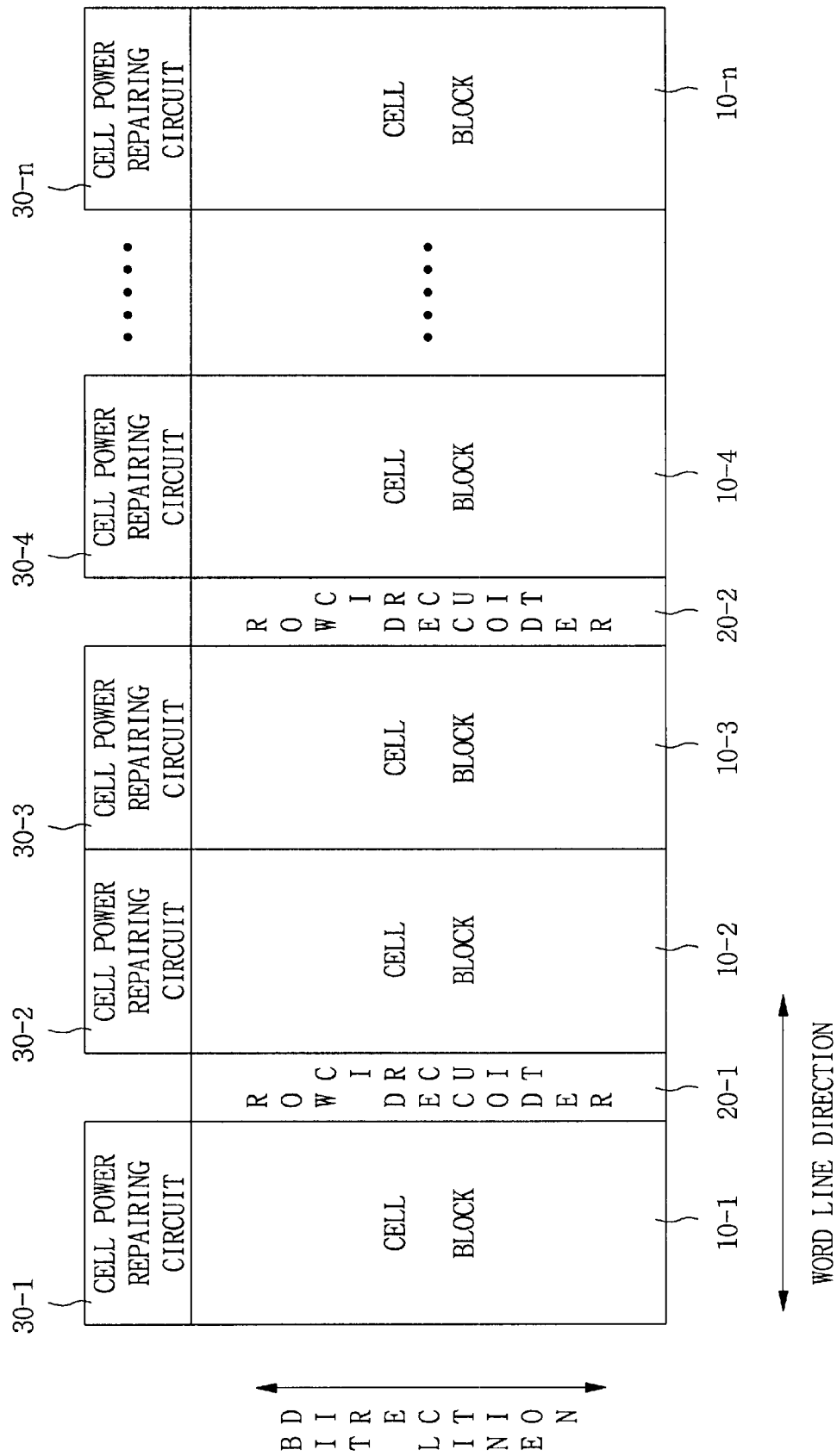
FIG. 1 is a schematic layout view for illustrating cell blocks, cell power repairing circuits and row decoder circuits of a semiconductor memory device in accordance with the prior art.

FIG. 1 is a schematic layout view for illustrating cell blocks, cell power repairing circuits and row decoder circuits of a semiconductor memory device in accordance with the prior art.

In accordance with an embodiment of the prior art shown in FIG. 1, a semiconductor memory device includes: n/2 row decoder circuits (20-1, 20-2, . . . ) respectively arranged between two neighboring cell blocks (10-1 and 10-2, 10-3 and 10-4, . . . ) of n cell blocks (10-1~10-n) of a memory cell array; and n cell power repairing circuits (30-1~30-n) arranged at the periphery of the memory cell array (the top part of FIG. 1) in the direction of word lines.

At this time, the n cell blocks (10-1~10-n), even if not shown in FIG. 1, respectively include a plurality of word lines, a plurality of bit lines, a plurality of cells connected between the word lines and bit lines for storing data and a plurality of cell power lines arranged between bit lines in an identical direction for providing supply voltage to the cells.

The n/2 row decoder circuits (20-1, 20-2, . . . ) respectively decode external row addresses to generate a selection signal to select a predetermined word line out of a plurality of word lines included in the two neighboring cell blocks (10-1 and 10-2, 10-3 and 10-4, . . . ). Specifically, the first row decoder circuit 20-1 is assigned for its two neighboring cell blocks (10-1, 10-2), and the second row decoder circuit (20-2) is arranged for its two neighboring cell blocks ( 10-3, 10-4). The rest of row decoder circuits not shown in the drawing are respectively assigned for the two neighboring blocks as such.

If there is any faulty cell causing standby current failure among a plurality of cells belonging to any cell blocks respectively assigned for the n cell power repairing circuits (30-1~30-n), the corresponding cell power repairing circuit selectively blocks an electrical connection only between the corresponding cell power line providing supply voltage to the faulty cell and power source. As a result, supply voltage stops flowing to all the cells (working cells as well as faulty cells) connected with the particular cell power line which has been disconnected from the power source. Then, those cells are replaced with redundancy cells, which means that any faulty cells are to be repaired by the unit of column.

Figure 2:
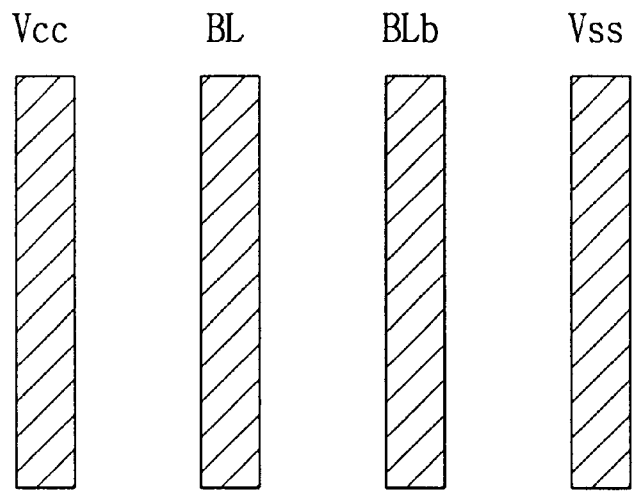
FIG. 2 illustrates wirings of cell power lines in accordance with the prior art.

FIG. 2 illustrates wirings of cell power lines in accordance with the prior art. The cell power lines Vcc providing supply voltage and the supply lines Vss providing ground voltage to a plurality of cells, both of which are connected with a pair of bit lines (BL, BLb), are arranged apart in a predetermined distance at both sides of the pair of bit lines (BL, BLb) in an identical direction. At this time, the cell power lines Vcc and ground voltage supply lines Vss are constructed the pair of bit lines (BL, BLb) on the same layer.

However, the arrangement of the cell power lines between the pair of bit lines in an identical direction results in an increase in the size of a chip. Thus, in order to reduce the size of a chip, the semiconductor memory device of the present invention is constructed in the structure that cell power lines are arranged between word lines in an identical direction and cell power repairing circuits between cell blocks of a memory cell array.

Hereinafter, a preferred embodiment of the present invention will be described in detail with reference to the accompanying drawings.

Figure 3:
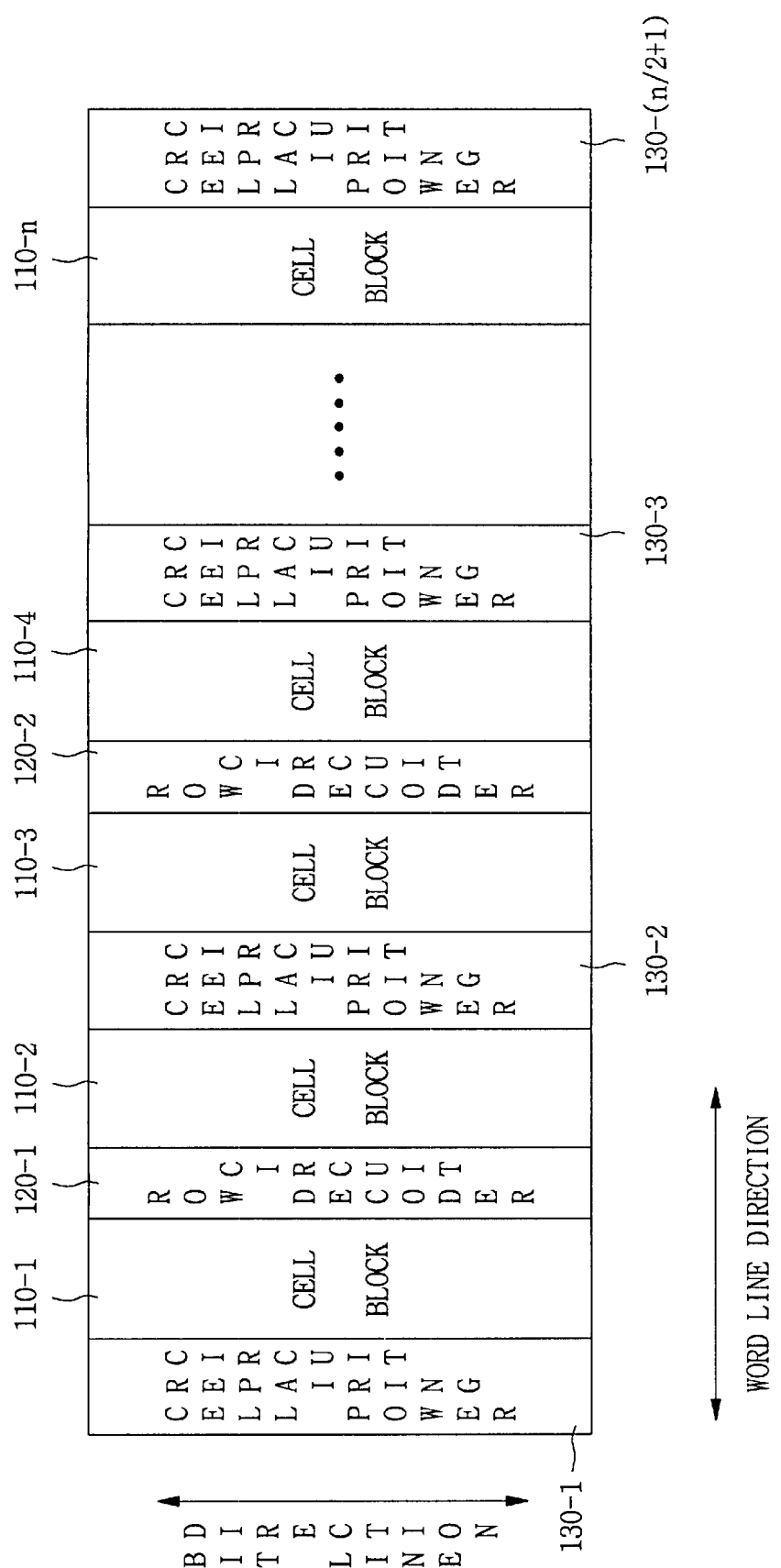
FIG. 3 is a schematic layout view for illustrating cell blocks, cell power repairing circuits and row decoder circuits of a semiconductor memory device in accordance with a first embodiment of the present invention.

FIG. 3 is a schematic layout view for illustrating cell blocks, cell power repairing circuits and row decoder circuits of a semiconductor memory device in accordance with a first embodiment of the present invention.

In accordance with the first embodiment of the present invention shown in FIG. 3, a semiconductor memory device is constructed in the structure that n/2 row decoder circuits (120-1, 120-2, . . . ) are respectively arranged between two neighboring cell blocks (110-1 and 110-2, 110-3 and 110-4, . . . ) of n cell blocks (110-1~110-n), and n/2+1 cell power repairing circuits (130-1~130-(n/2+1)) are respectively arranged between n cell blocks (110-1~110-n), that is, at the regions, where row decoder circuits (120-1, 120-2, . . . ) are not arranged, and at both sides of the memory cell array.

At this time, even if not shown in FIG. 3, n cell blocks (110-1~110-n) respectively have a plurality of word lines, a plurality of bit lines, a plurality of cells perpendicularly connected between the word lines and bit lines for storing data and a plurality of cell power lines arranged between the word lines in an identical direction for providing supply voltage to the cells. It should be noticed that the wiring direction of the power lines is different from that of the prior art (different from that of bit lines).

The n/2 row decoder circuits (120-1, 120-2, . . . ) respectively decode external row addresses to generate a selection signal to select a predetermined word line out of a plurality of word lines included in the two neighboring cell blocks (110-1 and 110-2, 110-3 and 110-4, . . . ). Specifically, the first row decoder circuit 120-1 is assigned for its two neighboring cell blocks (110-1, 110-2), and the second row decoder circuit (120-2) for its two neighboring cell blocks (110-3, 110-4). The rest of row decoder circuits not shown in the drawings are respectively assigned for the two neighboring blocks as such.

If there are one or two faulty cells (110-1 or 110-2 and 110-3, . . . ) causing standby current failure among a plurality of cells belonging to any cell blocks respectively assigned for the n/2+1 cell power repairing circuits (130-1~130-n(n/2+1)), the corresponding cell power repairing circuit (130-1~130-(n/2+1)) selectively blocks an electrical connection only between the cell power line providing supply voltage to the faulty cells and the power source. Specifically, the first and last cell power repairing circuits ((130-1), (130-(n/2+1))) are assigned for only one cell block (10-1, 110-n), and the rest of cell power repairing circuits (for instance, 130-2) are assigned for two cell blocks (for instance, 110-2, 110-3). At the same time, if the cell power repairing circuit stops supply voltage from flowing to the specific cell power line, supply voltage will not flow to all the cells connected with the corresponding cell power line (arranged in the direction of word lines). In other words, the faulty cells are to be repaired by the unit of row, differently from the prior art (by the unit of column).

Figure 4:
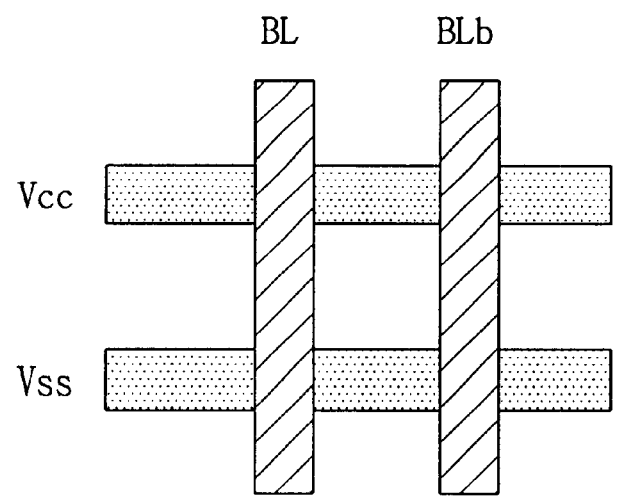
FIG. 4 illustrates wirings of cell power lines in accordance with the present invention.

FIG. 4 illustrates wirings of cell power lines in accordance with the present invention. Differently from the prior art, the cell power lines providing supply voltage Vcc and the lines providing ground voltage Vss to a plurality of cells connected with a predetermined word lines (not shown) are arranged in perpendicular to the pair of bit lines (BL, BLb), that is, in an identical direction to the word lines. At this time, the cell power lines Vcc and ground voltage supply lines Vss are constructed on the different layers. When FIG. 4 is compared with FIG. 2, it can be easily noticed that the chip gets smaller if the cell power lines Vcc and ground voltage supply lines Vss are arranged in the direction of word lines, rather than in the direction of bit lines.

Figure 5A:
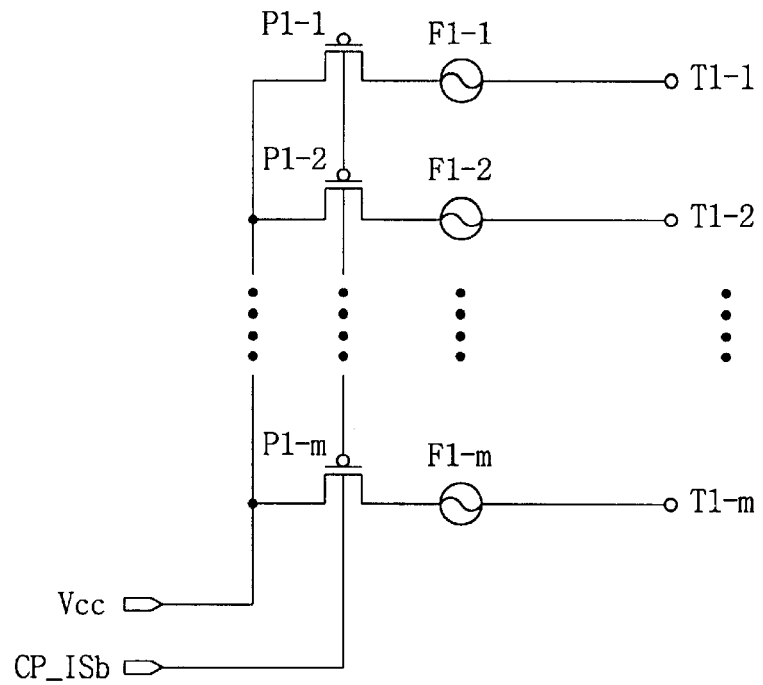
FIGS. 5a and 5b are perspective views for illustrating the first cell power repairing circuit shown in FIG. 3.
Figure 5B:
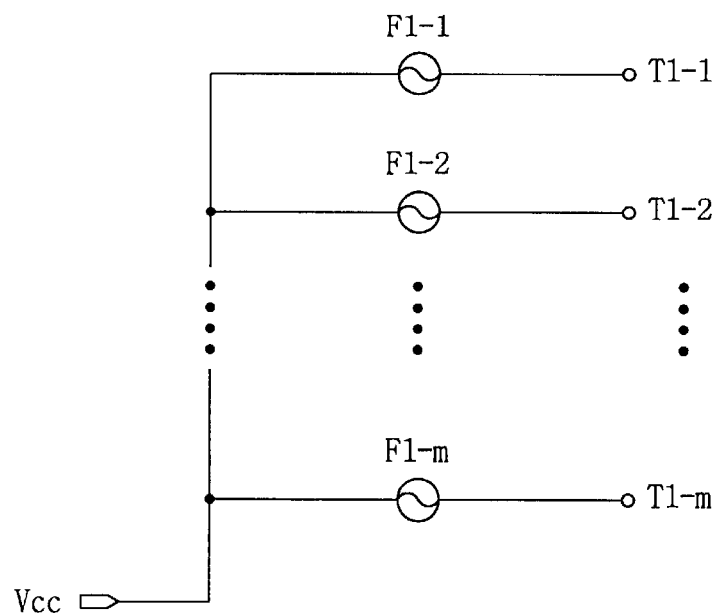

FIGS. 5a and 5b are perspective views for illustrating the first cell power repairing circuit shown in FIG. 3. The first cell power repairing circuit (130-1 shown in FIG. 3), as shown in FIG. 5a, includes m fuses (F1-1~F1-m) having one end (T1-1~T1-m) connected with other cell power lines, at least more than one cell power line among a plurality of cell power lines arranged in the first cell blocks (110-1 shown in FIG. 3); and m PMOS transistors (P1-1~P1-m) having drain connected with the other end of m fuses (T1-1~F1-m), source where the supply voltage is provided and gate where a "low" level of an enable signal (CP_ISb) is transmitted. As shown in FIG. 5b, the first cell power repairing circuit can also be constructed only with m fuses (F1-1~F1-m).

Figure 6A:
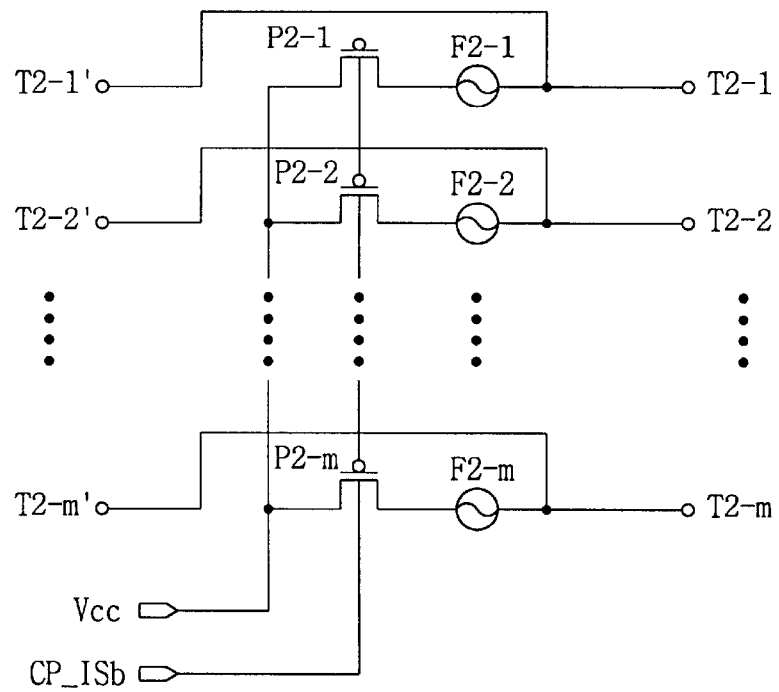
FIGS. 6a through 6c are perspective views for illustrating the first cell power repairing circuit disposed between the cell blocks shown in FIG. 3.
Figure 6B:
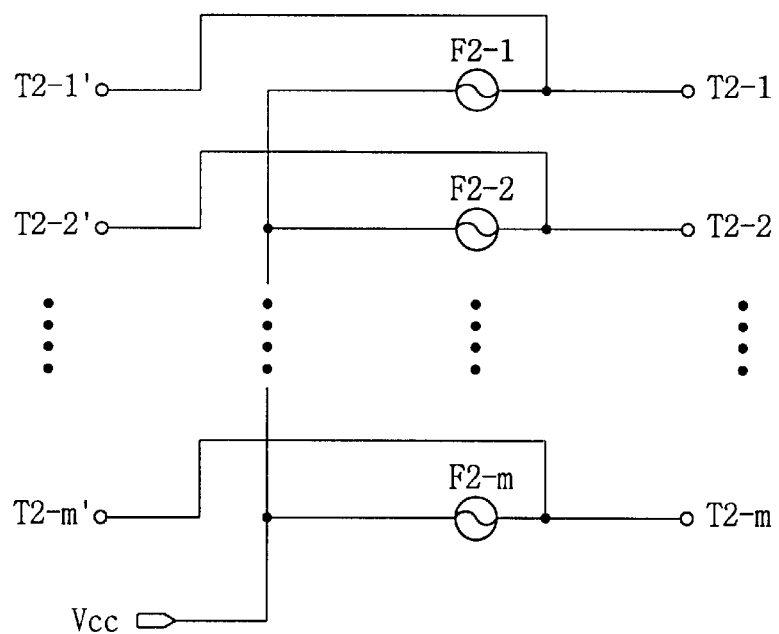
Figure 6C:
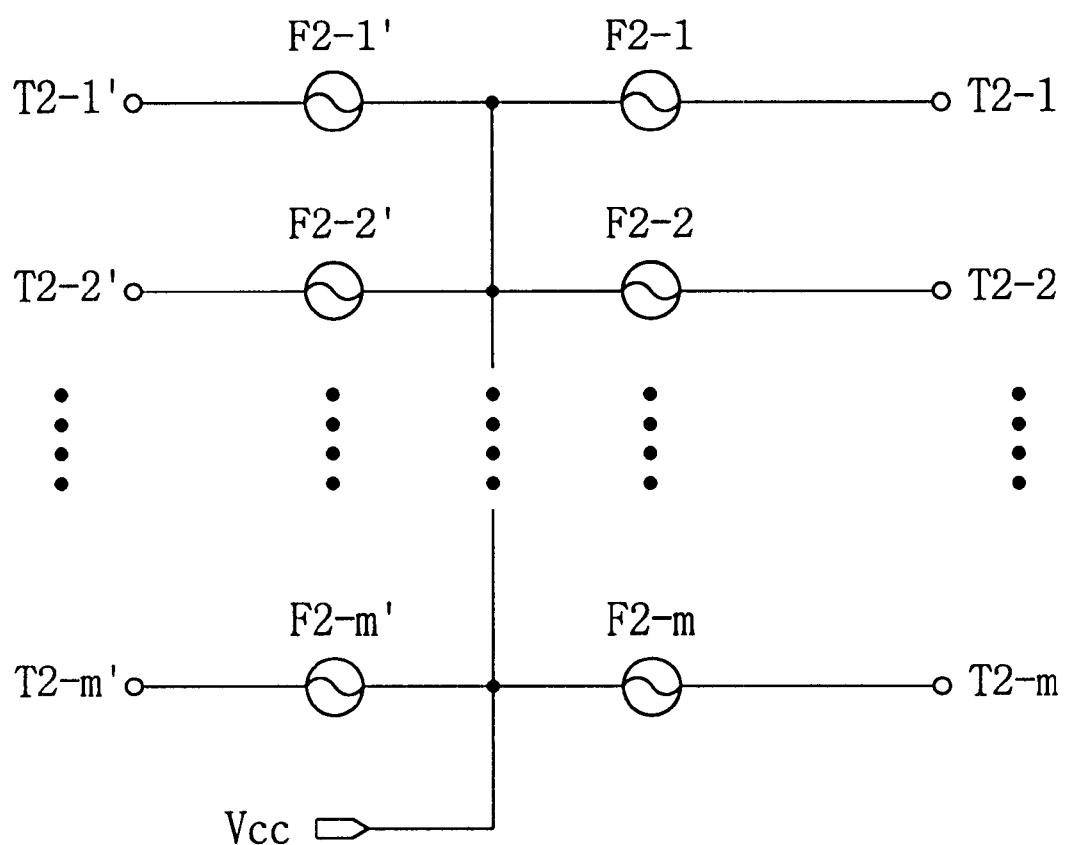

FIGS. 6a through 6c are perspective views for illustrating the cell power repairing circuits positioned between cell blocks. The cell power repairing circuits (130-2, 130-3, ... shown in FIG. 3) positioned between the cell blocks, as shown in FIG. 6a, includes m fuses (F2-2~F2-m) having one end (T2-1~T2-m) connected with other cell power lines, at least more than one cell power line among a plurality of cell power lines arranged for the two cell blocks (110-2, 110-3, ... shown in FIG. 3); and m PMOS transistors (P2-1~P2-m) having drain connected with the other end (T2-1'~T2-m') of m fuses (F2-1~F2-m), source where the supply voltage Vcc is provided and gate where a "low" level of an enable signal (CP_ISb) is transmitted. At this time, the cell power repairing circuits can also be constructed only with m fuses (F2-1~F2-m), as shown in FIG. 6b, or only with 2m fuses (F2-1~F2-m and F2-1'~F2-m'), as shown in FIG. 6c.

The one end (T2-1'~T2-m') positioned at the left side of the drawings, one of the ends (T2-1~T2-m, T2-1'~T2-m') of the m fuses (F2-1~F2-m) shown in FIGS. 6a through 6c, is connected with the cell power lines included in the one of the two cell blocks arranged for the corresponding cell power repairing circuit, and the other group (T2-1~T2-m) positioned at the right side of the drawings is connected with the cell power lines included in the other cell block.

Figure 7A:
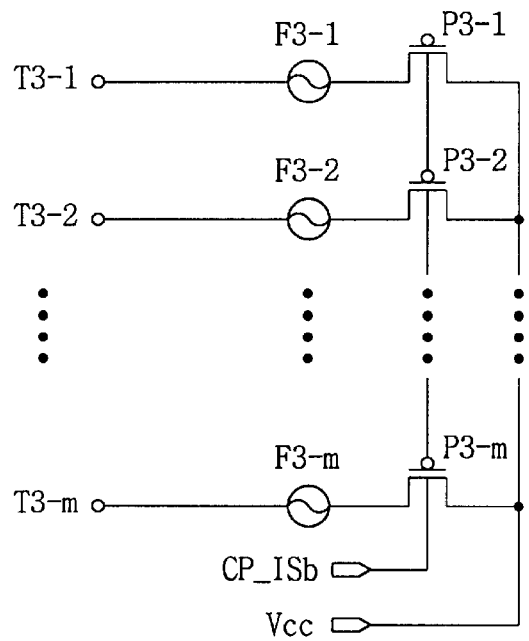
FIGS. 7a and 7b are perspective views for illustrating the last cell power repairing circuit shown in FIG. 3.
Figure 7B:
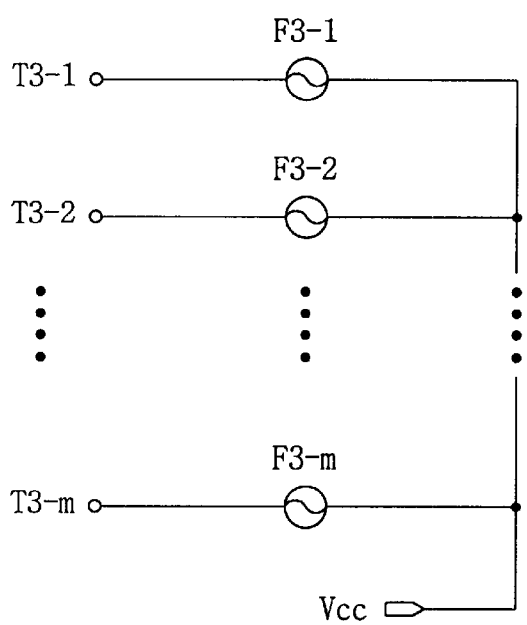

FIGS. 7a and 7b are perspective views for illustrating the last cell power repairing circuit shown in FIG. 3. The last cell power repairing circuit (130-(n/2+1) shown in FIG. 3), as shown in FIG. 7a, includes m fuses (F3-1~F3-m) having one end (T3-1~T3-m) connected with cell power lines, at least more than one cell power line among a plurality of cell power lines arranged for the last cell block (110-n shown in FIG. 3); and m PMOS transistors (P3-1~P3-m) having drain connected with the other end of m fuses (F3-1~F3-m), source where the supply voltage Vcc is provided and gate where a "low" level of an enable signal (CP$_{13}$ISB) is transmitted. At this time, the last cell power repairing circuit can also be constructed only with m fuses (F3-1~F3-m), as shown in FIG. 7b.

If there is any faulty cell causing the standby current failure among cells included in the n cell blocks (110-1~110-n), the fuses (F1-1~F1-m, F2-1~F2-m, F2-1'~F2-m', F3-1~F3-m) of the cell power repairing circuits shown in FIGS. 5a through 7b replaces the faulty cell with a redundancy cell by selectively disconnecting only the corresponding fuse connected with a cell power line providing supply voltage in the repairing process. At this time, the faulty cell is to be repaired by the unit of row.

Figure 8:
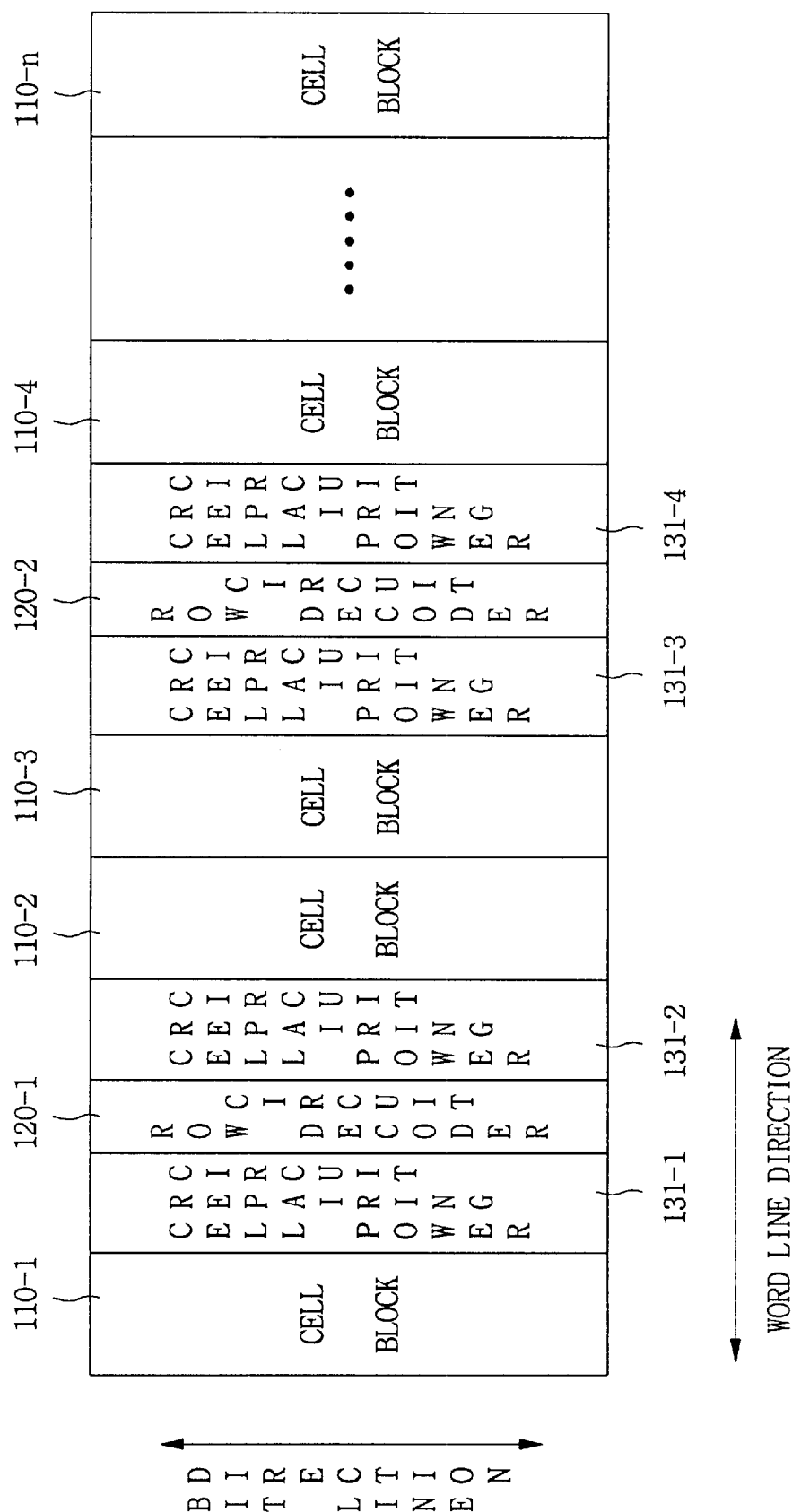
FIG. 8 is a schematic layout view for illustrating cell blocks, cell power repairing circuits and row decoder circuits of a semiconductor memory device in accordance with a second embodiment of the present invention.

FIG. 8 is a schematic layout view for illustrating cell blocks, cell power repairing circuits and row decoder circuits of a semiconductor memory device in accordance with the second embodiment of the present invention. In comparison with the first embodiment of the present invention shown in FIG. 3, it can be noticed that there are changes in the number and position of cell power repairing circuits.

In other words, according to the second embodiment of the present invention shown in FIG. 8, the semiconductor memory device is constructed in the structure that n cell power repairing circuits (131-1, 131-2, 131-3, 131-4, ... ) are respectively arranged at both sides of the n/2 row decoder circuits (120-1, 120-2, ... ) for each one of cell blocks (one of 110-1~110-n). Specifically, the first, second, third and fourth cell power repairing circuits (131-1, 131-2, 131-3, 131-4) are respectively assigned for cell blocks (110-1, 110-2, 110-3, 110-4), and the rest cell power repairing circuits are also arranged for one neighboring cell block in the same manner as described above.

At this time, among all the n cell power repairing circuits ((131-1, 131-2, 131-3, ... )) in the drawing, the cell power repairing circuits (131-1, 131-3, ... ) positioned at the left side of row decoder circuits (120-1, 120-2, ... ) are constructed in the structure shown in FIG. 7a or 7b, and the cell power repairing circuits (131-2, 131-4, ... ) positioned at the right side of row decoder circuits (120-1, 120-2, ... ) are constructed in the structure shown in FIG. 5a or 5b.

Figure 9:
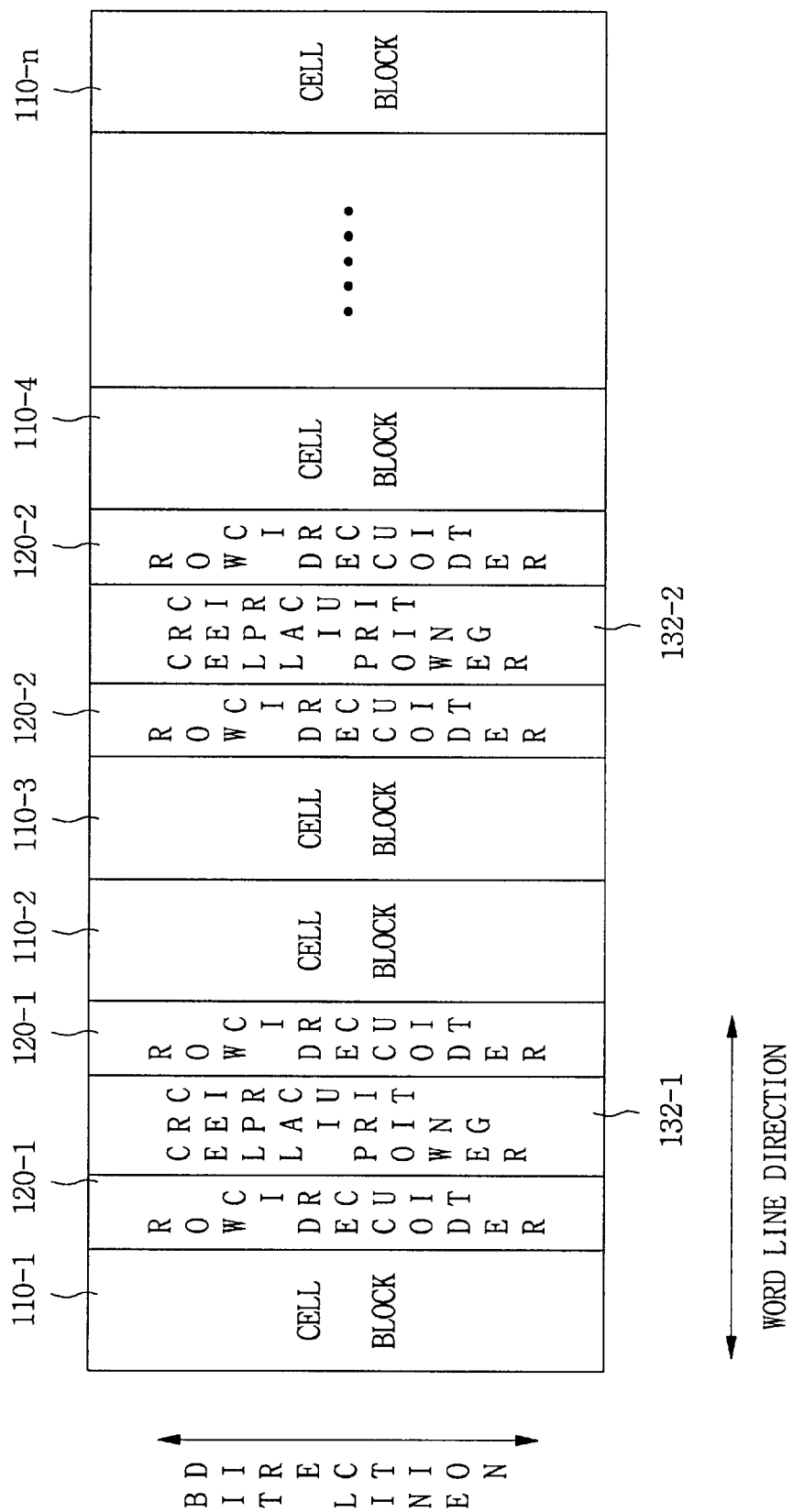
FIG. 9 is a schematic layout view for illustrating cell blocks, cell power repairing circuits and row decoder circuits of a semiconductor memory device in accordance with a third embodiment of the present invention.

FIG. 9 is a schematic layout view for illustrating cell blocks, cell power repairing circuits and row decoder circuits of a semiconductor memory device in accordance with the third embodiment of the present invention. In comparison with FIG. 3, it can be noticed that there are changes in the number and position of the cell power repairing circuits.

In other words, according to the third embodiment of the present invention, the semiconductor memory device shown in FIG. 9 is constructed in the structure that the n/2 cell power repairing circuits (132-1, 132-2, ... ) are respectively arranged between n/2 row decoder circuits (120-1, 120-2, ... ) for two cell blocks (110-1 and 110-2, 110-3 and 110-4, ... ) Specifically, the first cell power repairing circuit (132-1) is arranged for two cell blocks (110-1, 110-2), and the second cell power repairing circuit (132-2) is arranged for two cell blocks (110-3, 110-4). The rest of cell power repairing circuits are respectively arranged for the other two neighboring cell blocks in the same manner as described above.

At this time, the n/2 cell power repairing circuits (132-1, 132-2, ... ) are constructed in the structure shown in FIG. 6a, 6b or 6c.

Figure 10:
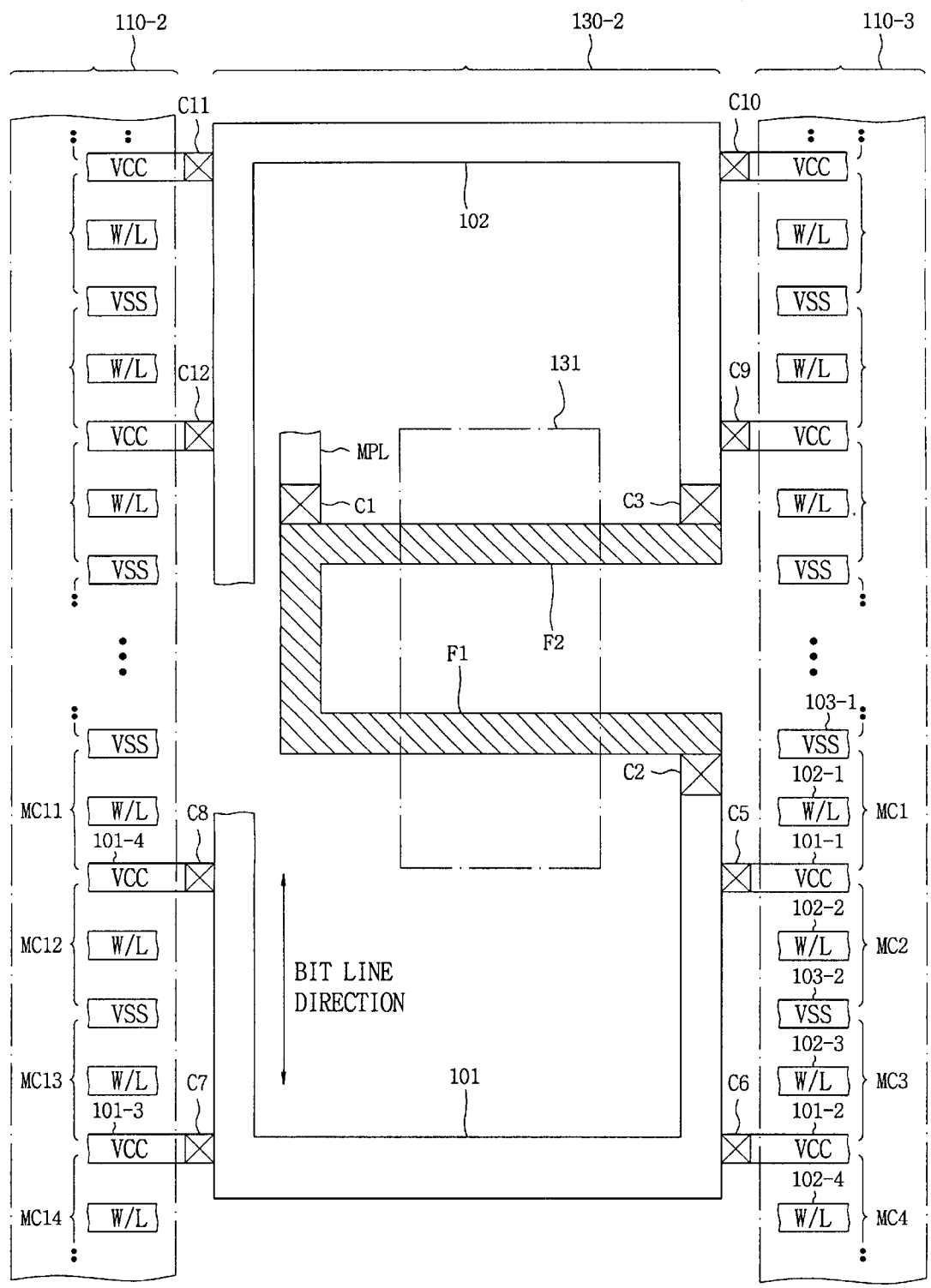
FIG. 10 is a perspective view for illustrating the actual arrangement of the cell power repairing circuit positioned between the cell blocks shown in FIG. 3 in relation to the power supply lines of the cell blocks.

FIG. 10 is a perspective view for illustrating the actual arrangement of the cell power repairing circuit positioned between the cell blocks shown in FIG. 3 in relation to the power supply lines of the cell blocks.

As shown in FIG. 10, one cell power repairing circuit (130-2) is connected with two cell blocks (110-2, 110-3). The power supply voltage induced to the power supply lines MPL flows through fuses (F1, F2), which practically construct the cell power repairing circuit 130-2, to the connecting lines (101, 102). The connecting lines (101, 102) are installed in connection with the cell power lines Vcc of the memory cell blocks 110-2, 110-3 through contacts (C5,C6, C7,C8,C9,C10,C11,C12).

As shown in FIG. 10, the cell power lines Vcc are metal wiring lines receiving power supply voltage, being arranged in parallel with ground voltage supply lines Vss and word lines (W/L) which are placed between the cell power lines Vcc and the ground voltage supply lines Vss. The fuses (F1, F2) are made of polysilicon layers that can be cut by laser beam. The power supply lines MPL and the cell power lines Vcc are made of metal layers respectively mixed with aluminum AL and tungsten W. At this time, the cell power lines Vcc are arranged under the layer of power supply lines MPL coupled with the bit lines (B/L) on the same layer, in perpendicular to the same on the different layers, over the layer of the polysilicon word lines (W/L).

For instance, if there is an occurrence of standby current failure at an memory cell to which cell supply voltage flows through the cell power line (101-1), the corresponding fuse (F1), one of all fuses that open through a window of about 4 $\mu$m, is cut by laser beam at an laser repairing step, one of the steps for fabricating a semiconductor device. Then, the cut fuse (F1) no longer provides supply voltage to the connecting line 101. As a result, the cell power lines Vcc of the memory cell blocks (110-2, 110-3) connected through contacts (C5,C6,C7,C8) no longer receive cell power, so as to solve the problem of standby current failure. At this time, the memory cells connected with the cell power lines, which no longer receive cell power, have been replaced with memory cells of redundancy blocks.

In other words, as the cell power repairing circuit (130-2) is arranged between the separate memory cell array blocks apart in the direction of word lines, and as the fuses of the cell power repairing circuits are respectively patterned in the direction of word lines and extensively arranged to the direction of bit lines, the semiconductor memory device can be highly integrated with the minimum area of the chip occupied by the circuits.

In FIG. 10, the fuses are in an electrical connection with a cell power line or cell power lines, which are also connected with the memory cells of the separate memory cell array blocks. In other words, the fuses are in an electrical connection with a cell power line or cell power lines connected with the memory cells included in one of the separate memory cell array blocks.

As described above, there is an advantage in the semiconductor memory device of the present invention in that cell power lines of cell blocks are arranged in the direction of word lines and the cell power repairing circuits are arranged between the cell blocks of the memory cell array, thereby reducing the size of a chip.

What is claimed is:

1. A semiconductor memory device comprising:
   a plurality of word lines, a plurality of bit lines, a plurality of cells connected between the word lines and bit lines for storing data and a memory cell array of a plurality of cell blocks having a plurality of cell power lines for providing supply voltage to the cells;
   a plurality of row decoder circuits for decoding external row addresses and generating selection signals for predetermined word lines included in the cell blocks; and
   a plurality of cell power repairing circuits for selectively blocking between cell power lines providing supply voltage to faulty cells and power source when there are any faulty cells causing standby current failure, wherein
   the cell power lines are arranged between the word lines in an identical direction;
   the row decoder circuits are respectively arranged between two neighboring cell blocks; and
   the cell power repairing circuits are also respectively arranged between cell blocks.

2. The device, as defined in claim 1, wherein the cell power repairing circuits in which the row decoder circuits are not respectively arranged between cell blocks at the areas, and the row decoder circuits are arranged at both sides of the memory cell array.

3. The device, as defined in claim 2, wherein the cell power repairing circuits include fuses having one end connected with cell power lines, at least more than one cell power line and the other end to which supply voltage flows.

4. The device, as defined in claim 2, wherein the cell power repairing circuits respectively comprises:
   a plurality of fuses having one end connected t o at least more than one of a plurality of cell power lines; and
   a plurality of PMOS transistors having drain connected with the other end of the fuses, source where the supply voltage is provided and gate where a "low" level of an enable signal is transmitted.

5. The device, as defined in claim 1, wherein the cell power repairing circuits are respectively arranged at both sides of the row decoder circuits.

6. The device, as defined in claim 5, wherein the cell power repairing circuits include fuses having one end connected with cell power lines, at least more than one cell power line and the other end to which supply voltage flows.

7. The device, as defined in claim 5, wherein the cell power repairing circuits respectively comprises:
   a plurality of fuses having one end connected to at least more than one of a plurality of cell power lines; and
   a plurality of PMOS transistors having drain connected with the other end of the fuses, source where the supply voltage is provided and gate where a "low" level of an enable signal is transmitted.

8. The device, as defined in claim 1, wherein the cell power repairing circuits are respectively arranged between the row decoder circuits.

9. The device, as defined in claim 8, wherein the cell power repairing circuits include fuses having one end connected with cell power lines, at least more than one cell power line and the other end to which supply voltage flows.

10. The device, as defined in claim 8, wherein the cell power repairing circuits respectively comprises:
    a plurality of fuses having one end connected to at least more than one of a plurality of cell power lines; and
    a plurality of PMOS transistors having drain connected with the other end of the fuses, source where the supply voltage is provided and gate where a "low" level of an enable signal is transmitted.

11. The device, as defined in claim 1, wherein the cell power repairing circuits include fuses having one end connected with cell power lines, at least more than one cell power line and the other end to which supply voltage flows.

12. The device, as defined in claim 1, wherein the cell power repairing circuits respectively comprises:
    a plurality of fuses having one end connected to at least more than one of a plurality of cell power lines; and
    a plurality of PMOS transistors having drain connected with the other end of the fuses, source where the supply voltage is provided and gate where a "low" level of an enable signal is transmitted.

13. A static random access memory device having cell power repairing circuits to selectively block an electrical connection between cell power lines relevant to power supply lines and faulty memory cells in occurrences of standby current failure, the circuits being arranged between separate cell array blocks in the direction of word lines, and fuses included in the cell power repairing circuits having a predetermined length and being arranged extensively in the direction of bit lines.

14. The device, as defined in claim 13, wherein the fuses are connected to the cell power line or cell power lines, which are in an electrical connection with memory cells included in the separate memory cell array blocks.

15. The device, as defined in claim 13, wherein the fuses are connected with the cell power line or cell power lines, which are in an electrical connection with memory cells included in one of the separate memory cell array blocks.

16. The device, as defined in claim 13, wherein the cell power lines are metal wires receiving power supply voltage, being arranged in parallel with ground voltage supply lines and having word lines between the power supply voltage lines and ground voltage supply lines.

17. The device, as defined in claim 13, wherein the fuses are made of polysilicon layers which can be cut by laser beam; the power supply lines are made of metal layers mixed with aluminum; and the cell power lines are made of metal layers mixed with tungsten.

18. The device, as defined in claim 17, wherein the cell power lines are arranged under the layer of the power supply lines coupled with the bit lines on the same layer, in perpendicular to the bit lines same on different layers, over the layer of the polysilicon word lines.

19. A method for arranging cell power repairing circuits of a memory device comprising the steps of:

placing cell power repairing circuits between separate memory cell array blocks in the direction of word lines for selectively blocking an electrical connection between power supply lines and cell power lines corresponding to faulty memory cells in an occurrence of standby current failure; and placing fuses of the cell power repairing circuits with a predetermined length in the direction of the word lines and extensively to the bit lines.

* * * * *